(12) United States Patent
Blanchet-Fincher

(10) Patent No.: US 7,229,676 B2
(45) Date of Patent: Jun. 12, 2007

(54) THERMAL IMAGING PROCESSES AND PRODUCTS OF ELECTROACTIVE ORGANIC MATERIAL

(75) Inventor: Graciela B. Blanchet-Fincher, Greenville, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 156 days.

(21) Appl. No.: 10/937,549

(22) Filed: Sep. 8, 2004

(65) Prior Publication Data

US 2005/0029934 A1 Feb. 10, 2005

Related U.S. Application Data

(62) Division of application No. 10/078,797, filed on Feb. 19, 2002, now Pat. No. 6,852,355.

(60) Provisional application No. 60/272,440, filed on Mar. 1, 2001.

(51) Int. Cl.
*B41M 5/40* (2006.01)

(52) U.S. Cl. .............. 428/32.6; 428/32.77; 428/32.81; 428/195.1; 428/690; 257/40; 257/41; 257/42; 257/43; 257/44; 430/258; 438/30; 438/40; 438/70; 438/83; 438/102; 438/103

(58) Field of Classification Search ............... 257/40, 257/41, 42, 43, 44; 438/30, 40, 70, 83, 102, 438/103; 428/690, 917, 195.1, 32.27, 32.77, 428/32.81, 32.6; 430/258
See application file for complete search history.

(56) References Cited

U.S. PATENT DOCUMENTS 3,639,123 A 2/1972 Gray (Continued)

FOREIGN PATENT DOCUMENTS

EP 0 851 714 A2 7/1998

(Continued)

OTHER PUBLICATIONS

Chang, Hsin-Hua, et al., Multicolor organic LEDs processed by integration of screen printing and thermal transfer printing, Proceedings of SPIE, 2000, 127-134, vol. 4079.

(Continued)

*Primary Examiner*—B. Shewareged
(74) *Attorney, Agent, or Firm*—John H. Lamming

(57) ABSTRACT

Processes for effecting thermal transfer of electroactive organic material are disclosed wherein unwanted portions of a layer of electroactive organic material supported by a donor element are removed or transferred from the layer by thermal transfer, particularly laser-induced thermal transfer, leaving a desired pattern of the electroactive organic material on the donor element. The electroactive organic material may be an organic material exhibiting electroluminescence, charge transport, charge injection, electrical conductivity, semiconductivity and/or exciton blocking. The layer of electroactive organic material may comprise more than one layer of different types of electroactive organic material. The exposure pattern is a negative image of the desired pattern. The electroactive organic material of the desired pattern is not, therefore, exposed to the heat which can cause decomposition. The desired pattern of electroactive organic material may then be gently transferred from the donor element to a desired substrate by lamination, for example, without damaging the electroactive organic material. The substrate may be used to form organic electronic devices, such as light emitting displays, photodetectors and photovoltaic cells. Donor elements for use in the processes are also disclosed.

6 Claims, 4 Drawing Sheets

U.S. PATENT DOCUMENTS

| | | |
|---|---|---|
| 5,156,938 A | 10/1992 | Foley et al. |
| 5,171,650 A | 12/1992 | Ellis et al. |
| 5,688,551 A | 11/1997 | Littman et al. |
| 5,710,097 A | 1/1998 | Staral et al. |
| 5,766,819 A | 6/1998 | Blanchet-Fincher |
| 5,851,709 A | 12/1998 | Grande et al. |
| 5,863,465 A | 1/1999 | Kinlen |
| 5,904,961 A | 5/1999 | Tang et al. |
| 6,022,440 A | 2/2000 | Nordeen et al. |
| 6,194,119 B1 | 2/2001 | Wolk et al. |
| 6,366,017 B1 | 4/2002 | Antoniadis et al. |
| 6,582,504 B1 | 6/2003 | Fujita |
| 2001/0000744 A1 | 5/2001 | Wolk et al. |
| 2001/0031342 A1 | 10/2001 | Engle et al. |
| 2001/0036561 A1 | 11/2001 | Wolk et al. |

FOREIGN PATENT DOCUMENTS

| | | |
|---|---|---|
| WO | WO 00/41893 A1 | 7/2000 |

OTHER PUBLICATIONS

Noach, Salman et al., Microfabrication of an electroluminescent polymer light emitting diode pixel array, Appl. Phys. Lett., Dec. 9, 1996, 3650-3652, 69(24), American Institute of Physics.

Rogers, John A. et al., Printing Process Suitable for Reel-to-Reel Production of High-Performance Organic Transistors and Circuits, Advanced Materials, 1999, 741-745, 11(9), Wiley-Vch, Weinheim, Germany.

THERMAL IMAGING PROCESSES AND PRODUCTS OF ELECTROACTIVE ORGANIC MATERIAL

RELATED APPLICATION

This application claims the benefit of the filing date of provisional application No. 60/272,440, filed Mar. 1, 2001, the contents of which is incorporated herein by reference.

FIELD OF THE INVENTION

This invention relates to improved processes and products for effecting thermal transfer imaging of electroactive organic materials, particularly laser-induced thermal transfer imaging.

BACKGROUND OF THE INVENTION

Thermal transfer processes are well known in applications such as color proofing. Such thermal transfer processes include, for example, dye sublimation, dye transfer, melt transfer, and ablative material transfer, and typically use a laser to induce thermal transfer of matter. These processes have been described in, for example, Baldock, U.K. Patent No. 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced thermal transfer processes typically use a donor element including a layer of material to be transferred ("transfer layer"), and a receiving element including a surface for receiving the transferred material. The donor element and the receiver element are brought into close proximity or into contact with each other and selectively exposed to laser radiation, usually by an infrared laser. Heat is generated in the exposed portions of the donor element by the absorption of the incoming laser radiation, causing transfer of those portions of the transfer layer onto the surface of the receiving element. Either the substrate of the donor element or the receiving element (or both) are transparent. If the material of the transfer layer does not absorb the incoming laser radiation, the donor element must also include a heating layer adjacent to the transfer layer and a supporting base element. The heating layer is a material which absorbs radiation, generating heat to cause the transfer of the transfer layer. The donor element may also include additional layers, such as an ejection layer between the heating layer and the transfer layer. The ejection layer decomposes into gaseous molecules when heated. The gaseous molecules propel the exposed portions of the transfer layer to the receiving element.

In a digital process, the exposure takes place only in a small, selected region of the assembly at one time, so that transfer of material from the donor element to the receiver element can be built up one pixel at a time. Computer control facilitates high resolution and high speed transfer. Alternatively, in an analog process, the entire assembly may be irradiated and a mask may be used to selectively expose desired portions of the thermally imageable layer. See, for example, U.S. Pat. Nos. 5,857,709 and 5,937,272.

Organic electronic devices, such as light emitting devices, photodetecting devices and photovoltaic cells, may be formed of a thin layer of electroactive organic material sandwiched between two electrical contact layers. Electroactive organic materials are organic materials exhibiting electroluminescence, photosensitivity, charge transport and/or injection, (hole or electron), electrical conductivity, and/or exciton blocking. The material may be semiconductive. At least one of the electrical contact layers is transparent to light so that light can pass through the electrical contact layer to or from the electroactive organic material layer. Other devices with similar structures include photoconductive cells, photoresistive cells, photodiodes, photoswitches and transistors.

Organic electroluminescent materials which emit light upon application of electricity across the electrical contact layers include organic molecules such as anthracene, butadienes, coumarin derivatives, acridine, and stilbene derivatives. See, for example, U.S. Pat. No. 4,356,429 to Tang. Semiconductive conjugated polymers have also been used as electroluminescent materials. See, for example, Friend et al., U.S. Pat. No. 5,247,190, Heeger et al., U.S. Pat. No. 5,408,109, and Nakano et al., Published European Patent Application 443 861. The electroactive organic materials can be tailored to provide emission at various wavelengths.

Light sensitive devices, such as photodetectors and photovoltaic cells, may also use certain conjugated polymers and electro- and photo-luminescent materials to generate an electrical signal in response to radiant energy. Electroluminescent materials mixed with a charge trapping material, such as buckminsterfullerene ($C_{60}$) and its derivatives, show such light sensitivity. See, for example, Yu, Gang, et al., "photovoltaic cells and photodetectors made with semiconductor polymers: Recent Progress", Conference 3939, Photonics West, San Jose, Calif., Jan. 22–28, 2000.

Organic electronic devices offer the advantages of flexibility, low cost and ease of manufacture. (Id.) Their performance approaches and in some cases even exceeds that of traditional photosensitive devices. (Id.)

Organic semiconducting material may also be used to form thin film transistors. Transistors may now be fabricated completely from organic materials. Transistors of organic materials are less expensive than traditional transistors and may be used in low end applications where lower switching speeds maybe acceptable and where it would be uneconomical to use traditional transistors. See, for example, Drury, C. J., et al., "Low-cost all-polymer integrated circuits", Appl. Phys. Lett., vol. 73, No. 1, 6 Jul. 1998, pp. 108–110. In addition, organic transistors may be flexible, which would also be advantageous in certain applications, such as to control light emitting diodes on a curved surface of a monitor. (Id.) Organic semiconducting materials include pentacene, polythienylene vinylene, thiophene oligomers, benzothiophene dimers, phthalocyanines and polyacetylenes. See, for example, U.S. Pat. No. 5,981,970 to Dimitrakopoulos et al., U.S. Pat. No. 5,625,199 to Bauntech, et al., U.S. Pat. No. 5,347,144 to Gamier, et al., and Klauck, Hagen et al., "Deposition: Pentacene organic thin-film transistors and ICs," Solid State Technology, Vol. 43, Issue 3, March 2, on pp. 63–75.

Electroactive organic materials may be applied to one of the electrical contact layers or onto a portion of a transistor by spin-coating, casting or ink-jet printing. They may also be applied directly by vapor deposition processes, depending on the nature of the materials. An electroactive polymer precursor may also be applied and converted to a polymer, typically by heat. Such methods may be complex, slow, expensive, lack sufficient resolution and when patterned using the standard lithographic (wet development) techniques, expose the device to deleterious heat and chemical processes.

Ink jet printing has been used to apply pixels of electroactive organic material having diameters of about 350 to about 100 microns. See, for example, U.S. Pat. No. 6,087,196, EP 0880303A1, WO99/66483 and WO9943031. See also U.S. Pat. No. 5,989,945 for the use of ink jet printing to apply a resist. It has been claimed that pixels with diameters of about 35 microns have been applied in conventional printing applications such as short run color printing and the production of verification proofs for color reproduction.

Organic electronic devices such as photoemitting, photodetecting and photovoltaic devices typically include a layer of charge injection/transport material adjacent to the electroluminescent organic material to facilitate charge transport (electron or hole transport) and/or gap matching of the electroactive organic material and an electrical contact. Charge injection/transport materials have not been patterned. Charge injection/transport materials of low conductivity must therefore be used to avoid cross-talk between pixels.

Patterning materials using thermal transfer processes is generally faster and less expensive than patterning by using analog processes in combination with wet development techniques. Thermal transfer processes, particularly laser-induced thermal transfer processes, may also provide greater resolution. It would be advantageous to apply thermal transfer processes, particularly laser-induced thermal transfer processes, to the application of electroactive organic materials.

SUMMARY OF THE INVENTION

The present invention is directed to a method of providing a patterned layer of electroactive organic material, including selectively exposing to heat a donor element including a transfer layer of thermally imageable electroactive organic material to remove unwanted portions of the electroactive organic material from the transfer layer, thereby forming a desired patterned layer of electroactive organic material on the donor element.

A second embodiment of the invention involves the imagewise exposing to laser radiation a thermally imageable element including a transfer layer of multiple layers of electroactive organic material, one of which layers is a layer of charge injection/transport material, whereby the exposed areas of the transfer layer are removed to form the desired patterned layer of electroactive organic material and charge injection/transport material on the thermally imageable element.

A third embodiment of the invention involves selectively exposing to heat a donor element comprising a transfer layer of charge injection/transport material to remove unwanted portions of the charge injection/transport material from the transfer layer, thereby forming a desired patterned layer of charge injection/transport material on the donor element.

A fourth embodiment of the invention involves exposing to heat a donor element including a transfer layer of thermally imageable electroactive organic material in an exposure pattern comprising a negative image of the desired pattern, to remove unwanted portions of the electroactive organic material from the transfer layer.

A fifth embodiment of the invention is directed to a method of forming an organic electronic device, including providing a donor element including a patterned layer of electroactive organic material; providing a substrate comprising a first electrical contact layer; transferring the patterned layer to the substrate such that a first surface of the patterned layer is adjacent to the first electrical contact layer; and providing a second electrical contact layer adjacent to a second surface of the patterned layer.

A sixth embodiment is directed to an article of manufacture, including a base element and a transferable layer including a desired pattern of electroactive organic material supported by the base element, wherein the transferable layer has been formed into the desired pattern by selective heating to remove unwanted portions of electroactive organic material from the transferable layer.

A seventh embodiment is directed to an organic electronic device, including a first electrical contact layer; a second electrical contact layer; and a pixelated pattern of electroactive organic material between the first and second electrical contact layers; wherein the pixelated pattern comprises at least about 10,000 pixels per square centimeter.

An eighth embodiment is directed to an organic electronic device, including a first electrical contact layer; a second electrical contact layer; and a pixelated pattern of electroactive organic material between the first and second electrical contact layers; wherein each pixel has a length less than about 100 microns, down to about 10 microns, and each pixel has a width less than about 100 microns, down to about 10 microns.

We have found that current thermal transfer processes typically cause the partial decomposition of the material of the transferred layer at the absorbing interface. While such decomposition may be acceptable for most thermal transfer processes where the thickness of the material to be transferred is 10,000 Angstroms or more, decomposition of a thinner material may be an issue. For example, electroactive organic material layers in organic electronic devices, such as light emitting displays, photodetectors, photovoltaic cells and semiconductors, are typically from about 100 Angstroms to about 5,000 Angstroms thick. Decomposition of the electroactive organic material at the interface between the electroactive organic material and a heating layer leads to the vaporization of a considerable fraction of the material that is to be transferred. Much or all of the transferred electroactive organic material may thereby be destroyed or degraded in a thermal transfer process by exposure to elevated temperatures in the presence of oxygen or by direct vaporization. Thermal transfer processes that do not damage such thin layers of electroactive organic material would be useful.

As used herein, the term "organic electronic device" refers to an electronic device in which any electroactive component, is an organic material.

As used herein, the phrase "adjacent to" does not necessarily mean that one layer is immediately next to another layer. An intermediate layer or layers may be provided between layers said to be adjacent to each other. The term "photoactive organic material" refers to any organic material that exhibit electroluminescence and/or photosensitivity.

DETAILED DESCRIPTION OF THE INVENTION

In accordance with the present invention, unwanted portions of a transfer layer of electroactive organic material supported by a donor element are exposed by heat to transfer the unwanted portions of the electroactive organic material from the transfer layer. The exposure pattern is a negative image of the desired pattern. After exposure of the transfer layer, a desired pattern of electroactive organic material remains on the donor element. The heat exposing the unwanted portions of the electroactive organic material is localized and dissipates quickly. The electroactive organic material of the desired pattern is not, therefore, exposed to sufficient heat to cause decomposition of the material. The desired pattern may then be transferred to a substrate in a second step of the process without the use of excessive heat, such as by lamination, which will not cause decomposition of the patterned layer. Where multiple patterned layers of electroactive organic materials are made in accordance to the method of the invention, the transfer layer of the donor element and the resulting first patterned layer on the donor element may also include a second patterned layer of electroactive organic material. In organic electronic devices containing both photoactive organic material and charge injection/transport organic material, the photactive organic material and the charge injection/transport material typically have the same pattern.

The donor element and an optional receiving element used in the first step of the processes of the present invention will now be described.

The Donor Element and the Receiver Element

Figure 1:
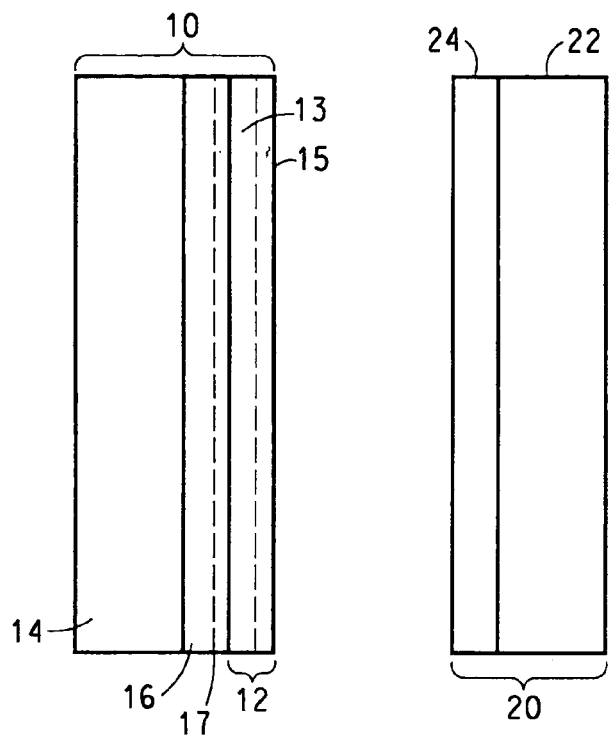
FIG. 1 is an exemplary donor element and an optional receiver element for use with the processes of the present invention.

FIG. 1 is an exemplary donor element (10) and a receiver element (20) for use with the processes of the present invention.

Figure 2:
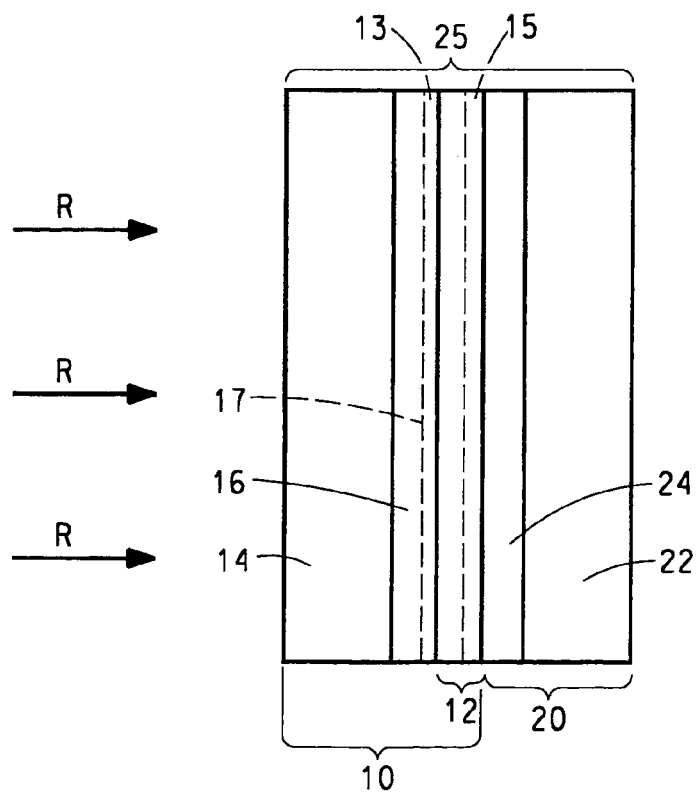
FIG. 2 shows the exposure of an assembly of the donor element and receiver element of FIG. 1, in accordance with the present invention.

As best seen in FIGS. 1 and 2, the donor element (10) comprises a thermally imageable transfer layer (12) comprising at least one layer of electroactive organic material (13), a base element (14) and a heating layer (16) between the base element (14) and the transfer layer (12). The base element (14) provides support for the heating layer (16) and the transfer layer (12). The transfer layer (12) may also comprise one or more additional layers of different electroactive organic materials. For example, the layer (13) may be an electroluminescent material and an optional layer (15) may be a charge injection/transport material. The optional layer (15) is shown on a side of the first electroactive organic material (13) opposite the heating layer (16). Alternatively (not shown) the optional layer (15) may also be between the electroactive organic material layer (13) and the heating layer (16), depending on the configuration on the substrate or the resulting device.

The receiver element (20) comprises a receiver support (22) and an optional adhesive coating (24).

The receiver element (20) is preferably provided adjacent to the transfer layer (12) of the donor element (10) to receive the unwanted, exposed portions of the electroactive organic material (13) in the first step of the processes of the present invention.

The base element (14) of the donor element (10) and the receiver support (22) of the receiver element are dimensionally stable sheet materials. Preferably, the donor element (14) and the receiver support (22) are flexible to facilitate subsequent processing steps, as described further, below. At least one of the base element (14) and the receiver support (22) is transparent to laser radiation (R) to allow for exposure of the transfer layer (12), as described further, below.

Examples of transparent, flexible films appropriate for use as the base element (14) include, for example, polyethylene terephthalate ("polyester"), polyether sulfone, polyimides, poly(vinyl alcohol-co-acetal), polyethylenes, or cellulose esters, such as cellulose acetate, and polyvinyl chloride. Preferably, the base element (14) of the donor element (10) is polyethylene terephthalate that has been plasma treated to accept the heating layer (16). The same materials may be used for the receiver support (22). Opaque materials, such as polyethylene terephthalate filled with a white pigment such as titanium dioxide, ivory paper or synthetic paper, such as Tyvek® spunbonded polyolefin (available from E.I. du Pont de Nemours and Company, Wilmington, Del.), may also be used for the receiver support (22).

Heating Layer

As best seen in FIG. 2, the function of the heating layer (16) of the donor element (10) is to absorb the laser radiation (R) used to expose the electroactive organic material of the transfer layer (12) and to convert the radiation into heat. The heating layer is typically a metal.

Nickel, aluminum, chromium, vanadium, and alloys thereof, are preferred metals for the heating layer (16). Electron beam deposited nickel is most preferred because it has been found that the release of the electroactive organic material may be best facilitated from nickel by oxygen plasma treatment, as discussed further, below.

Figure 4:
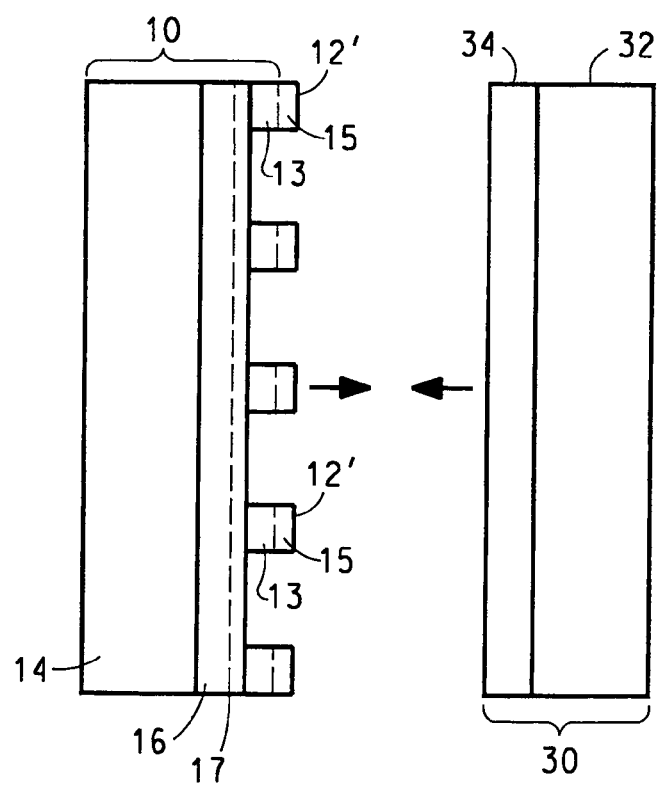
FIG. 4 shows the donor element of FIG. 3 and a substrate for receiving the patterned layer.

Examples of other suitable materials are transition metal elements and metallic elements of Groups 13, 14, 15 and 16 (according to the new IUPAC format listed in the Handbook of Chemistry and Physics, 81$^{st}$ Edition (CRC Press, Boca Raton, Fla. 2000–2001), wherein the groups are numbered 1–18 from left to right of the periodic table), their alloys with each other, and their alloys with the elements of Groups 1 and 2, and which absorb the wavelength of the laser. The alloys with the elements of Groups 1 and 2 generally have less adhesion to the electroactive organic material, or may be treated to have less adhesion, than the adhesion of the electroactive organic material to the receiving surface of the substrate (30), as best seen in FIG. 4. Tungsten (W) is an example of a suitable transition metal.

Carbon, a Group 14 nonmetallic element, can also be used.

Alternatively, the heating layer can be an organic layer comprising an organic binder and an infrared absorber. Examples of suitable binders are those that decompose at fairly low temperatures when heated such as polyvinyl chloride, chlorinated polyvinyl chloride and nitrocellulose. Examples of near infrared absorbers are carbon black and infrared dyes.

The thickness of the heating layer depends on the optical absorption of the metals used. For chromium, nickel vanadium or nickel, a layer of 80–100 Angstroms is preferred. An aluminum heating layer about 40–50 Angstroms thick, shows high optical absorption. If carbon is used, the heating layer would be from about 500 to about 1,000 Angstroms.

Although it is preferred to have a single heating layer, it is also possible to have more than one heating layer, and the different layers can have the same or different compositions.

The heating layer (16) may be applied to the base element (14) by a physical vapor deposition technique. The term "physical vapor deposition" refers to various deposition approaches carried out in vacuum. Thus, for example, physical vapor deposition includes all forms of sputtering, including ion beam sputtering, as well as all forms of vapor deposition, such as electron beam evaporation and chemical vapor deposition. A specific form of physical vapor deposition useful in the present invention is a rf magnetron sputtering. Nickel may be electron beam deposited onto the base element (14). Aluminum may be applied by resistive heating. Chromium, nickel and nickel vanadium layers may be applied by either sputtering or electron beam deposition.

Figure 3:
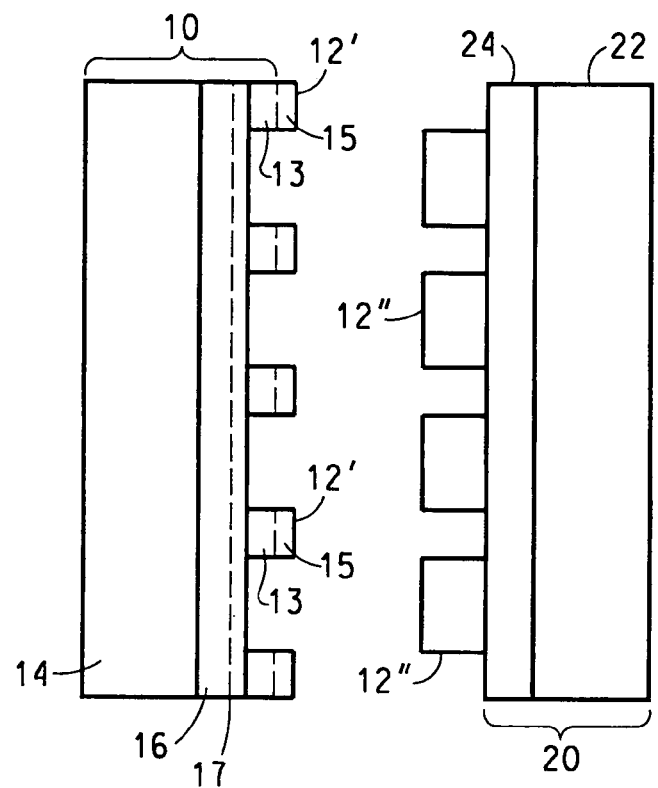
FIG. 3 shows the donor element of receiver element of FIG. 2 after exposure and separation, wherein the donor element includes a patterned layer to be transferred, in accordance with the present invention.
Figure 5:
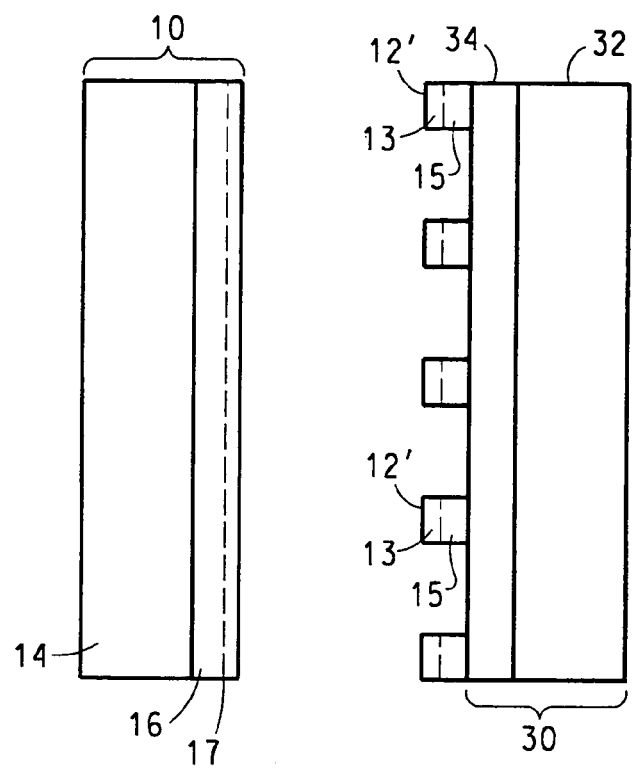
FIG. 5 shows the donor element and substrate of FIG. 4, after transfer of the patterned layer.

As best seen in FIGS. 3–5, to facilitate transfer of the patterned layer (12') of electroactive organic material to the desired substrate in the second step of the process, described below, it is important that the adhesion of the heating layer (16) to the electroactive organic material be less than the adhesion of the electroactive organic material (13) or optional layer (15) (if present), to the substrate. A release means (17) is therefore preferably provided between the heating layer (16) and the layer of electroactive organic material (12). The release means (17) may be provided by oxygen plasma treating the heating layer (16). It has been found that oxygen plasma treatment of at least about 45 seconds and preferably about 90 seconds facilitates transfer of the desired pattern of electroactive organic material to the substrate by lamination, without damage to the electroactive organic material. An oxide layer may also be formed on the surface of the heating layer (16) adjacent to the layer of electroactive organic material. The oxide layer may have a thickness of a few monolayers. Alternatively, release layers of monolayer thickness may also be coated directly onto the heating layer surface, such as by bar coating. Suitable release layer materials include polydimethylsiloxane, available from Polysciences, Inc., (Warrington, Pa.), iso-dichlorosilane perfluorodecane, available from Gelest Inc. (Tullytown, Pa.), hexamethyldi-silazane (HMDS), available from Arch Chemicals, Inc. (Norwalk, Conn.), dichlorosilane perfluorodecane, also available from Gelest Inc. and tridecafluoro-1,1,2,2-tetrahydrooctyl-1-methyldichlorosilane, available from United Chemical Technologies, Inc. (Bristol Pa.). The release means may also be a heat-activated release material.

Electroactive Organic Material

As best seen in FIGS. 1 and 2, the at least one transfer layer or layers (12) of electroactive organic material comprises any organic material which has one or more of the following characteristics: electroluminescence, photosensitivity, charge transport and/or charge injection (hole or electron), electrical conductivity and exciton blocking. The electroactive organic material may comprise organic molecules or polymers. It includes semiconducting organic materials. The electroactive organic material layer generally has a thickness in the range of 100–5000 Angstroms. Preferably, the electroactive organic material has a thickness of from about 500 to about 2,000 Angstroms. Specific electroactive organic materials which maybe used in the processes of the present invention are discussed further, below.

As mentioned above, the transfer layer of electroactive organic material layer (12) may include one or more types of electroactive organic material. For example, the transfer layer (12) may comprise a layer of electroluminescent material (13) and a layer of charge injection/transport material (15).

Charge injection/transport material facilitates electrical charge transport (electron or hole transport) and/or gap matching of the electroactive organic material and an electrical contact in an organic electronic device. Gap matching is matching the gap between the highest occupied valence band level and the lowest, unoccupied conduction band. Polyaniline and poly(dioxythiophene) are examples of charge injection/transport materials. Other examples of charge injection/transport materials are discussed further, below.

Ejection Layer

An ejection layer (not shown) may optionally be provided between the heating layer (16) and the layer of electroactive organic material (12), as is known in the art. The ejection layer decomposes into gaseous molecules when heated, providing additional force to cause transfer of the unwanted portions of the electroactive organic material layer (12) to the receiver element (20) in the exposed areas. A polymer having a relatively low decomposition temperature (less than about 350° C., preferably less than about 325° C., and more preferably less than about 280° C.) may be used. In the case of polymers having more than one decomposition temperature, the first decomposition temperature should be lower than 350° C. Suitable ejection layers are disclosed in U.S. Pat. No. 5,766,819, assigned to the assignee of the present invention. Thermal additives may also be provided in the ejection layer to amplify the effect of the heat generated in the heating layer (16), as is known in the art and also described in U.S. Pat. No. 5,766,819. U.S. Pat. No. 5,766,819 is incorporated by reference herein. By providing an additional decomposition pathway for the creation of gaseous products, additional propulsive forces can be generated to assist in the transfer process.

Where an ejection layer is provided, the release means (17) discussed above would facilitate transfer of the material of the ejection layer adjacent the exposed portions of the heating layer (16), from the heating layer (16).

Adhesive Coating

As best seen in FIGS. 1–3, adhesive coating (24) of the receiver element (20) facilitates the adhesion of the exposed portions of the transfer layer (12) to the receiver element (20). The adhesive force of the adhesive coating (24) should not be so high that the unexposed portions of the transfer layer (12) are removed from the transfer layer (12) by the adhesive coating (24), as is known in the art. The adhesive coating (24) may be a suitable polycarbonate, a polyurethane, a polyester, polyvinyl chloride, styrene/acrylonitrile copolymer, poly(caprolactone), vinylacetate copolymers with ethylene and/or vinyl chloride, (meth)acrylate homopolymers (such as butyl-methacrylate), copolymers, and mixtures thereof.

The Process of the Present Invention

In the first step of a preferred embodiment of the processes of the present invention, the uncovered surface of the transfer layer (12) of one or more layers of electroactive organic material (13), (15) of the donor element (10) is brought into contact with the adhesive layer (22) of the receiving element (20) to form an assembly (25), as best seen in FIG. 2. Vacuum and/or pressure can be used to hold the donor element (10) and the receiver element (20) together to form the assembly (25). As another alternative, the donor element (10) and receiver element (20) can be taped together and taped to the imaging apparatus. A pin/clamping system can also be used. As yet another alternative, the donor element (10) can be laminated to the receiver element (20). Alternatively, the surface of the donor element may be roughened during coating by laminating a matte polyethylene coversheet to improve the contact with the receiver element (20) and to facilitate the removal of air from between the donor element (10) and the receiver element (20).

Unwanted portions of the thermally imageable transfer layer (12) of electroactive organic material are then exposed through the donor element (10) by radiation (R) in the form of heat or light. If the receiver support (22) is transparent, it is also possible to expose the donor element to radiation (R) through the receiver support (not shown). As mentioned above, the exposure pattern is the negative image of the desired pattern. The heating layer (16) absorbs the radiation (R), generating heat which causes vaporization of the unwanted portions of the transfer layer (12), transferring the material of the unwanted portions from the transfer layer (12) of the donor element (10) to the receiver element (20).

After exposure, the donor element (10) is separated from the receiver element (20). This may be done by simply peeling the two elements apart. Very little peel force is typically required; the donor support (10) may simply be separated from the receiver element (20). Any conventional manual or automatic separation technique may be used.

After separation of the donor element (10) and the receiver element (20), the desired pattern (12') of first electroactive organic material (13) and optional second electroactive organic material (15) remains on the donor element (10) while the exposed, unwanted portions (12") of the transfer layer (12) are on the receiver element (20), as best seen in FIG. 3.

As best seen in FIG. 2, the radiation (R) is preferably provided by a laser. Laser radiation may be provided at a laser fluence of up to about 1 J/cm$^2$, preferably about 75–440 mJ/cm$^2$. Other techniques that generate sufficient heat to cause transfer of the electroactive organic material layer may be used, as well. For example, a thermal print head, or microscopic arrays of metallic tips with diameters ranging from about 50 nanometers, such as those used in atomic force microscopy, to about 5 microns, may also be used. A current is provided to the metallic tips to generate the heat. Higher resolutions may be obtained with small metallic tips than with a laser.

Various types of lasers may be used to expose the thermally imageable transfer layer (12) of electroactive organic material. The laser preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories, San Jose, Calif. Other types of lasers may also be used, as is known in the art, providing that the absorption of the heating layer (16) matches the emitting wavelength of the laser.

If the donor element (10) and the receiver element (20) are both flexible, the assembly (25) can be conveniently mounted on a drum to facilitate laser imaging.

After formation of the patterned layer (12') of first electroactive organic material (13) and optional second electroactive organic material (15) on the donor element (10) and separation of the donor element (10) from the receiver element (20) (if used), as best seen in FIG. 3, the donor element (10), including the patterned layer (12'), is brought into contact with a desired substrate (30), as best seen in FIG. 4. The substrate (30) may include a base element (32) and an adhesive coating (34) to increase the adhesion of the patterned layer (12') to the substrate. The adhesive coating (34) may be one of the materials discussed above with respect to the adhesive coating (22) of the receiver element (20). As mentioned above, it is important that the receiving surface of the substrate (30) have greater adhesion to the electroactive organic material of the desired pattern (12') than the adhesion of the pattern (12') to the heating layer (16) with the release means (17). The substrate (30) may be a portion of an electronic organic device, such as the anode or cathode of a light emitting display, a photodetecting device, or a photovoltaic cell, for example, as described further, below. The substrate may also be part of a transistor.

Preferably, the desired pattern (12') is transferred to the substrate (30) by lamination. Roll-to-roll or press lamination may be used, as is known in the art. A roll-to-roll Water-Proof® Laminator, manufactured by DuPont, Wilmington, Del., is preferably used to accomplish the lamination. Where roll-to-roll lamination is used, both of the donor element (10) and the substrate (30) must be flexible. In press lamination, neither need be flexible. A pressure of about 5,000–10,000 pounds per square inch (about 500–1,000 kilograms per square centimeters) may be used in press lamination.

After separation of the donor element (10) from the substrate (30), the desired pattern (12') of first electroactive organic material (13) and optional second electroactive material (15) is transferred to the substrate, as best seen in FIG. 5.

The process may be repeated with different donor elements to apply patterns of different electroactive organic materials on the same surface of the substrate (30), adjacent to each other.

The process of the present invention is particularly useful to transfer layers of electroactive organic material as thin as about 100 Angstroms up to about 5000 Angstroms, which cannot be transferred by conventional thermal transfer techniques without significant degradation of the transferred layer. Preferably, the layer of electroactive organic material is between about 500 to about 2,000 Angstroms thick. Thicker layers of electroactive organic material may also be applied with the process of the present invention.

Organic Electronic Devices

Figure 6:
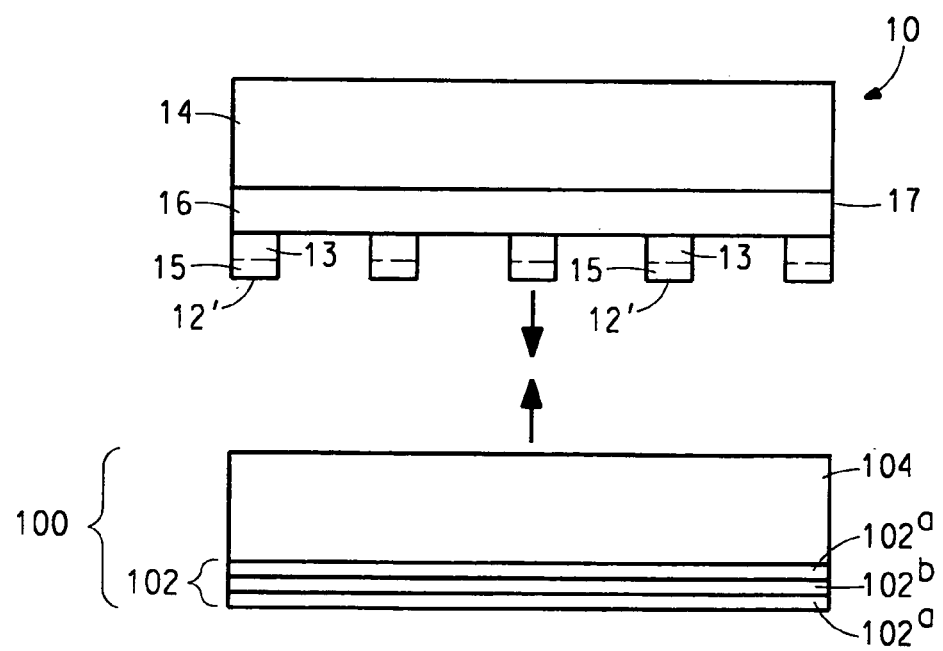
FIG. 6 shows a donor element including a patterned transfer layer in accordance with the present invention and an anode substrate of an organic electronic device.
Figure 7:
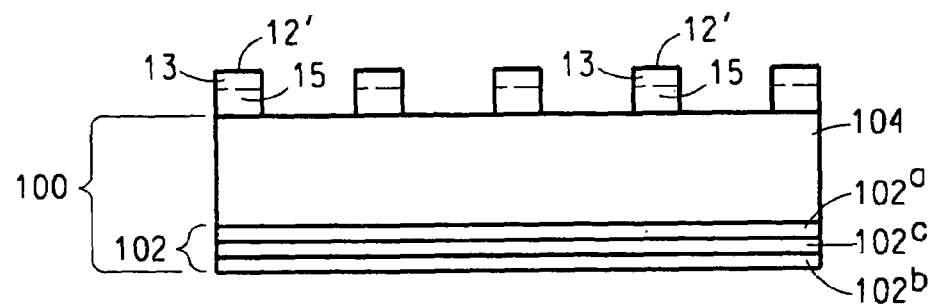
FIG. 7 shows the anode substrate of FIG. 6 after transfer of the patterned layer.
Figure 8:
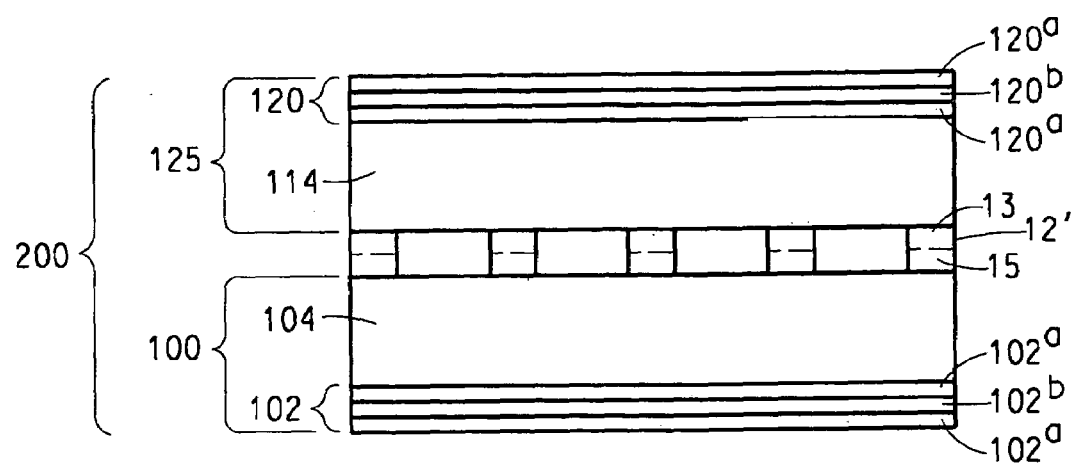
FIG. 8 shows the anode substrate of FIG. 7 after application of a cathode.

As discussed above, the desired substrate used as the receiving element (20) in the processes of the present invention may be an anode of a photoemitting, photodetecting or photovoltaic organic electronic device, for example. FIGS. 6–8 illustrate formation of such a device.

As best seen in FIG. 6, an anode substrate (100) of such an organic electronic device typically comprises a support element (102) and a transparent, first electrical contact layer (104). A donor element (10) useful for making the organic layers of an organic electronic device in accordance to the invention includes a desired patterned layer (12') comprising a first electroactive organic material layer (13), and a second electroactive organic material layer (15) for transfer to the first electrical contact layer (104). Preferably the first electroactive layer is a photoactive organic material layer and the second electroactive layer is a charge injection/transport material layer. The desired patterned layer (12') of first electroactive organic material (13) and second electroactive organic material (15) is formed on the donor element (10) by the process described above with respect to FIGS. 1–3. The desired patterned layer (12') of first electroactive organic material (13) and second electroactive organic material layer (15) is preferably applied to the first electrical contact layer (104) by lamination also, as described above with respect to FIGS. 4–5.

As best seen in FIGS. 7 and 8, after transfer of the desired patterned layer (12') of first electroactive organic material (13) and second electroactive organic material (15) to the first electrical contact layer (104), a cathode portion (125) of the organic electronic device is applied. The cathode portion (125) comprises a second electrical contact layer (114), which is applied over the electroactive organic material (13) of the patterned layer (12'). A second supporting element (120) is then applied over the second electrical contact layer (114), forming the organic electronic device (200), as best seen in FIG. 8.

Alternatively, the first electroactive organic material may be applied in a pattern by one donor element and the second electroactive organic material (15) may then be applied in a pattern by a second donor element. In that case, each donor element would comprise a transfer layer (12) of a single type of electroactive organic material.

Although less preferred, a charge injection/transport material (15) may also be applied to the anode substrate (100) by conventional techniques, such as by coating techniques. As discussed above, the preferred embodiment of the present invention reduces cross-talk between pixels, enabling the use of charge injection/transport materials having higher conductivity.

The components of the organic electronic device (200) will now be described in more detail.

The Anode and Cathode Support Elements

If the organic electronic device is to be flexible, such as a photoemitting device to be positioned on a curved surface, such as a computer screen, the first support element (102) of the anode portion (100) and the second support element (20) are preferably composite structures including at least one layer of flexible polymeric film and at least one layer of a flexible barrier material, as described in application No. PCT/US00/11534, filed on Apr. 17, 2000, assigned to the assignee of the present invention. As described in that application, the flexible barrier material protects the electrical contact layers (104) (114) and the patterned layer (12') of first electroactive organic material (13) and second electroactive organic material (15), from exposure to oxygen, water vapor and heat during subsequent processing steps. Two layers of flexible polymeric material (102a) (120a), on opposing sides of a layer of flexible barrier material (102b) (120b), are preferred, as best seen in FIG. 6 and FIG. 8.

Suitable flexible polymeric films include polyethylene terephthalate, polyethylene naphthalate, polyamides, and combinations thereof, polyolefins, polyamides, polyacrylonitrile, polymethacrylonitrile, perfluorinated and partially fluorinated polymers, polycarbonates, polyvinyl chloride, polyurethane, polyacrylic resins, epoxy resins, and a novolac resin. Typical support thicknesses range from about 1 to 10 mils (about 25–250 microns).

In a photoemitting, photodetecting or photovoltaic device, at least one of the support elements needs to be light-transmitting to allow for the passage of light. Light-transmitting barrier materials include nitrides, fluorides, carbides, glasses and inorganic oxides. Silicon nitrides, aluminum oxides and silicon oxides are preferred. Application No. PCT/US00/11534 describes suitable materials in more detail. In the embodiment of FIG. 8, the supporting element (102) of the anode portion (100), through which light is emitted or received, includes light-transmitting barrier material. For example, silicon nitride having a thickness of from about 200–500 nanometers may be used. The layer or layers of polymeric film (102a) may be sealed to the layer of barrier material (102b) by an adhesive.

The support elements (102) (120) may extend beyond the boundaries of the adjacent electrical contacts (104) (114), respectively, and the periphery of the support elements (102) (120) may be sealed together, by an adhesive, for example, to completely surround the electrical contacts (104) (114) and the pattern of electroactive organic material. Portions of the electrical contacts (104) (114) required for connection to drive or signal receiving circuitry may extend through the support elements (102) (120).

If the organic electronic device need not be flexible, the support element (102) may be glass, as is known in the art and described in U.S. Pat. No. 5,427,858 to Nahamura et al., U.S. Pat. No. 5,482,896 to Tony and U.S. Pat. No. 5,073,446 to Scozza et al., for example.

The First Electrical Contact Layer

In this example, the substrate (100) is an anode portion of the organic electronic device 200, through which light is emitted or received. The first electrical contact layer (104) is, therefore, a transparent material. A conducting mixed-metal oxide of Groups 2, 3 and 4, such as indium tin oxide, or a conducting polymer, such as polyaniline or poly(dioxythiophene), may be used. Indium tin oxide ("ITO") is preferred.

Mixed metal oxides such as indium tin oxide may be applied to one surface of the base element (102) by the vapor deposition techniques discussed above. Polyaniline and other conducting polymers may be applied by spin coating, bar coating and web coating.

The first electrical contact layer may be patterned, as desired. For example, the first electrical contact layer (104) may be a series of parallel strips forming electrode lines for addressing individual pixels of the pattern (12') first electroactive organic material (13) on the display. The second electrical contact layer (114), discussed further below, may also be a series of parallel strips forming electrode lines perpendicular to the electrode lines of the first electrical contact layer (104) forming a matrix, as is known in the art. In such an organic electronic device (200), the pattern (12') of first electroactive organic material (13) would be positioned with respect to the first electrical contact layer (104) to correspond to the overlapping portions of the first and second electrical contact layers (104) (114) in the matrix, also as is known in the art.

The first electrical contact layer (104) can be applied to the support element (102) in the desired pattern by positioning a patterned mask or photoresist on the support element (102) prior to applying the material of the first electrical contact layer (104). Alternatively, the first electrical contact layer can be applied as an overall layer and subsequently patterned using, for example, a photoresist and wet chemical etching.

The first electrical contact layer typically has a thickness range of from about 500 Angstroms to about 5,000 Angstroms.

The first electrical contact layer (114) may include extended portions (not shown) to connect the device to external circuitry. Other means of circuitry connection, such as vias, may also be provided. Via openings can either be formed in each layer as the device is assembled, or formed by drilling through all the layers after the device is assembled. The openings are then plated through well-known techniques described in, for example, Sinnadurai, handbook of Microelectronic Packaging and Interconnection Technologies (Electrochemical Publications Ltd., 1985). If vias are used, the openings should be completely sealed around the connecting wires to protect the active layer from exposure to the external environment.

Charge Injection/Transport Layer

In a preferred embodiment where the first electroactive layer is a photoactive organic material layer and the second electroactive layer is a charge injection/transport material layer. The charge injection/transport layer (15) facilitates electrical charge transport (electron or hole transport) and/or gap matching of the photoactive organic material layer (13) and the first electrical contact layer (104). If both the photoactive organic material (13) and the charge injection/transport material (15) are coated on the heating layer (16) of the donor element (10), as in the preferred embodiment, the wetting of the charge injection/transport material (15) to the photoactive organic material (13) should be sufficient to form a continuous film. If the charge injection/transport material (15) is provided on the anode portion (100) by conventional techniques and the patterned layer (12') of photoactive organic material (13) is transferred to the charge injection/transport material layer (15), the adhesion of the charge injection/transport material (15) to the photoactive organic material (13) must be stronger than the adhesion of the photoactive organic material (13) to the metal of the heating layer (16) (and associated release means (17)) of the donor element (10).

Examples of hole transport materials for layer have been summarized, for example, in Kirk-Othmer Encyclopedia of Chemical Technology, Fourth Edition, Vol. 18, p. 837–860, 1996, by Y. Wang. Both hole transporting molecules and polymers can be used.

Commonly used hole transporting molecules are: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), Tetrakis-(3-methylphenyl)-N,N,N',N'-2,5-phenylenediamine (PDA), a-Phenyl-4-N,N-diphenylaminostyrene (TPS), p-(Diethylamino)benzaldehyde diphenylhydrazone (DEH), Triphenylamine (TPA), Bis[4-(N,N-diethylamino)-2-methylphenyl](4-methylphenyl)methane (MPMP), 1-Phenyl-3-[p-(diethylamino)styryl]-5-[p-(diethylamino)phenyl]pyrazoline (PPR or DEASP), 1,2-Trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine.

Commonly used hole transporting polymers are polyvinylcarbazole, (phenylmethyl)polysilane, polyaniline, poly(dioxythiophene) (preferably, poly(3,4-ethylenedioxythiophene) "PEDOT"), and doped forms thereof. It is also possible to obtain hole transporting polymers by doping hole transporting molecules, such as those mentioned above into polymers such as polystyrene and polycarbonate.

Examples of electron transport materials for the charge injection layer (106) include metal chelated oxinoid compounds, such as $Alq_3$; phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). The charge injection layer (106) can function both to facilitate electron transport, and can also serve as a buffer layer or confinement layer to prevent quenching of the exciton at layer interfaces. Preferably, this layer promotes electron mobility and reduces exciton quenching.

Polyaniline and the PEDOT may be spin coated onto the first electrical contact layer (104).

The thickness of the charge injection layer may be about 100 to about 5,000 Angstroms, preferably 1,000 to 2,000 Angstroms.

Photoactive Organic Material

In a preferred embodiment where the first electroactive layer is a photoactive organic material layer and the second electroactive layer is a charge injection/transport material layer, the particular photoactive organic material of the pattern (12') depends on the type of the electronic organic device (200). In photoemitting devices, such as a light emitting display, the photoactive organic material is a light emitting material that is activated by a sufficient applied voltage. In photosensitive devices, such as a photoconductive or photovoltaic cell, the electroactive organic material is a layer of material that responds to radiant energy and generates a signal with or without an applied bias voltage.

Where the organic electronic device (200) of FIG. 8 is a photoemitting device, the light-emitting material may be any organic electroluminescent or other organic light-emitting materials. Anthracene, naphthalene, phenanthrene, pyrene, chysene, perylene, butadienes such as 1,4-diphenylbutadiene and tetraphenylbutadiene, coumarin derivatives, acridine and stilbenes such as transtilbene, may be used, for example, as described in U.S. Pat. No. 4,356,429 to Tang and U.S. Pat. No. 4,539,507 to Van Slyke et al., which are incorporated herein by reference. Metal chelated oxinoid compounds, such as AlQ3, can be used, as described in, for example, U.S. Pat. No. 5,047,687 to Van Slyke, which is incorporated herein by reference.

Alternatively, semiconductive conjugated polymer materials may be used, such as those described in U.S. Pat. No. 5,247,190 to Friend et al., U.S. Pat. No. 5,408,109 to Heeger et al. and U.S. Pat. No. 5,317,169 to Nakano et al., which are incorporated by reference herein. Examples of such polymers include poly(p-phenylenevinylene) referred to as PPV and poly (2,7-(9,9-dialkylfluorene)). PPV is preferred because its lifetime exceeds that of polyfluorenes. Mixtures of electroactive materials, such as mixtures of light emitting polymers, may also be used.

Where the electronic organic device (200) of FIG. 8 is a photodetecting device or a photovoltaic cell, the electroactive organic material may be an organic material which responds to radiant energy and produces a signal either with or without a biased voltage. Materials that respond to radiant energy and are capable of generating a signal without a biased voltage (such as in the case of certain photoconductive cells or photovoltaic cells) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, *Journal of Electronic Materials*, Vol. 23, pp 925–928 (1994); and MEH-PPV Composites with CN—PPV ("Efficient Photodiodes from Interpenetrating Polymer Networks", J. J. M. Halls et al. (Cambridge group) *Nature* Vol. 376, pp. 498–500, 1995).

Organic materials that respond to radiant energy and are capable of generating a signal with a biased voltage (such as in the case of photoconductive cells, photoresistors, photoswitches, phototransistors, phototubes) include, for example, many conjugated polymers and electroluminescent materials mixed with a charge trapping material, such as fullerene ($C_{60}$). G. Yu, et al. "photovoltaic cells and photodetectors made with semiconductor polymers: Recent Progress", Conference 3939, Photonics West, San Jose, Calif., Jan. 22–28, 2000.

The desired pattern (12') of photoactive organic material (13) may be a series of pixels. By "pixel" is meant the smallest addressable of the element of a display. In accordance with the process of the present invention, at least about 10,000 pixels per square centimeter may be transferred to the anode substrate (100). Each pixel may be square and have a length and width of less than about 100 microns. Using lasers having an imaging beam with a 5 micron diameter, it is possible to image pixels with a 5 micron length and width, and any multiple of that. Pixels may be readily formed by the present invention with a length and width of about 50 microns. As shown in Example I below, we have successfully patterned and transferred lines and spaces as small as 30 microns, which in turn demonstrates that it is possible to pattern pixels of 30 microns×30 microns. It is believed that pixels as small as 10 microns×10 microns may be patterned and transferred by the process of the present invention.

The photoactive organic material layer generally has a thickness in the range of 100–5000 Angstroms. Preferably, the thickness of the photoactive organic material layer is about 500 to about 2,000 Angstroms.

Second Electrical Contact Layer

The second electrical contact layer (114) of the cathode portion (125) is applied adjacent to the pattern (12') of the first electroactive organic material (13) so that the pattern (12') is between the first electrical contact layer (104) and the second electrical contact layer (114).

The second electrical contact layer (114) of the cathode portion (125) can be any metal or nonmetal having a lower work function than the first electrical contact layer (104) of the anode portion of the device (200). Materials for the second electrical contact layer can be selected from alkalil metals of Group 1 (e.g., Li, Cs), the Group 2 (alkaline earth) metals, the lanthanides and the actinides. Materials such as aluminum, indium, calcium, barium, magnesium and ytterbium, as well as combinations thereof, can be used. Ytterbium and aluminum are preferred.

The second electrical contact layer (114) may be applied to the pattern (12') of electroactive organic material by a physical vapor deposition process and patterned by conventional techniques, as describe above with respect to the first electrical contact layer (104). The second electrical contact layer (114) may be patterned as a series of parallel strips perpendicular to the parallel strips of the first electrical contact (104)

The second electrical contact layer (104) typically has a thickness in the range of 500–5,000 Angstroms. If the cathode is barium or calcium, the thickness is about 50 Angstroms. Such electrical contact layers are typically capped by aluminum, such that the overall thickness of the cathode is in the range of 500–5000 Angstroms. If the cathode is ytterbium or aluminum, no capping layer is needed and the thickness of the single layer itself is in the 500–5000 Angstrom range.

The support element (120) may be attached to the second electrical contact layer (114) by adhesive.

As discussed above with respect to the first electrical contact layer (104), the second contact layer (114) may also include extended portions or vias (not shown) for connection to external circuitry.

Multi-Step Transfer Processes

As mentioned above, the process of the present invention may be repeated multiple times with different donor elements to apply patterns of different electroactive organic materials or electroactive material adjacent to each other on the same layer of the substrate. Patterns of different electroactive organic materials may be applied to the same layer in registry, as is known in the art. In a light emitting display, different organic electroluminescent materials which emit light at different wavelength bands, and hence, at different colors, may be applied at locations corresponding to different overlapping portions of the first and second electrical contact layers (104) (114), to create a multi-color display. As described in U.S. Pat. No. 5,877,695 to Kubes, et al., electroluminescent materials have been developed which exhibit the colors green, yellow, blue, red and orange. The conjugated polymer poly-p-phenylene vinylene ("PPV") emits a yellow green light when energized while variants of PPV have demonstrated emission of red and blue light. Hydroxyquinoline-aluminum compounds also emit light in varying colors. Polymers emitting light of different colors are available from Covion Organic Semiconductors GmbH (Frankfurt, Germany).

A multi-color display having high pixel density, small pixel size and high emission efficiency can thereby be made in accordance with the processes of the present invention.

EXAMPLES

These non-limiting examples demonstrate the processes and products claimed and described herein.

Example I

A surface of a donor element comprising an 8 inch×4 inch (20.32 cm×10.16 cm), 4 mil (0.00635 mm) thick base element of polyester was coated with an 80 Angstrom heating layer of nickel vanadium to 40% transmission by Vacuum Deposit Incorporated, Louisville, Ky.

The coated base element was cleaned by soaking the coated base element in a tray of acetone for from 30 seconds to one minute and then rinsing the base element with an acetone spray bottle. The coated base element was then placed in a tray of water, wiped and placed again in a tray of water for transport to a clean area laboratory for dry cleaning.

The metal coated base element was blow dried with nitrogen and then positioned in the center of a plasma chamber. The chamber was evacuated and then oxygen was provided in the chamber, to 0.5 Torr. An oxygen plasma was generated through use of a radio-frequency source operated at 80 watts. The metal coated base element was subjected to the oxygen plasma for 90 seconds, to lower the adhesion between the metal coating and electroactive organic material.

A layer of electroactive organic material was then applied to the surface of the metal coated donor element by hand coating a solution of 1.5 milliliters of 0.5% poly(9,9-dialkylfluorene-2,7-diyl) in 0.5% toluene using a size 0 Meyer rod and air dried for 5 minutes, completing the donor element. Poly(9,9-dialkylfluorene-2,7-diyl) is a light emitting polymer. The layer of light emitting polymer was about 7,000 Angstroms thick. A plurality of donor elements were prepared.

After drying, the surfaces of the donor elements coated with the light emitting polymer were placed in contact with 4 inch×7 inch (10.16 cm×17.78 cm) poly-caprolactone receivers. The donor element/receiver assemblies were taped onto a 30×40 inch (76.2 cm×101.6 cm) aluminum plate which was automatically loaded onto a CREO 3244 Spectrum Trendsetter exposure unit available from Creo-Scitex, Inc., Vancouver, Canada, for a standard offset plate. The unit comprises an 81.2 cm long drum with a 91 cm perimeter. A 40 watt infrared diode laser emitted radiation through a light valve, which splits the radiation into an array of 240 overlapping, 5×2 micron spots, at 830 nanometers at a 1 microsecond pulse width.

The assemblies were exposed through the polyester base element in a pattern comprising a series of parallel, 30 micron vertical lines and spaces, which was a negative of the desired pattern, at a constant laser power, at a series of drum speeds varying from 100 to 200 RPM (sensitivities of 100 to 300 mJ/cm$^2$).

The desired pattern of a series of parallel, 30 micron vertical lines of the light-emitting polymer separated by 30 micron spaces was observed on the donor elements under a microscope at 50×enlargement.

Example II

In this Example, patterned electyroactive materials were applied to an anode portion of a light emitting display.

To prepare a donor element including a 2 mil. (0.00325 mm) polyester base element and a heating layer of electron beam deposited nickel was obtained from Vacuum Deposit Incorporated. The nickel was deposited to 35% transmission. The coated base element was cleaned using the sequential acetone, methanol and water rinse, dried with ionized nitrogen and oxygen plasma treated for 90 seconds, as described in Example I. The light-emitting polymer of Example I was then applied as described in Example I to complete the donor element. The donor element was placed in contact with a poly-caprolactone receiver and the assembly was then exposed by a CREO 3244 Trensetter, as described in Example I, to form a patterned layer of light-emitting polymer on the donor element.

The substrate comprised a 2 inch×2 inch (5.08 cm×5.08 cm) polyester base element 7 mils. (0.036285 mm) thick and an electrical contact layer of indium tin oxide applied to the base element by sputtering. The coated substrate was obtained from Southwall Technologies, Inc., Palo Alto, Calif., under the trade name Altair™ 0–60-HS. The layer of indium tin oxide was 7 mils. (0.036285 mm) thick. The resistivity of the indium tin oxide was 60 ohm/square cm.

The material of the charge injection layer comprised Baytron® P, a solution of poly(3,4-ethylenedioxythiophene) ("PEDOT") and polystyrene solution ("PSS") in water, with a total solid content of 1.3% by weight, available from Bayer (Leverkusen, Germany). Baytron® P is a hole injection material. The Baytron® P was mixed with a diluted solution of polystrene sulfonic acid ("PSSA") to yield a solution of 2% solids. 87.00 grams of the solution was prepared by mixing 60 grams Baytron® P, 3.2 grams PSSA (30% water) and 23.80 grams water.

The charge injection/transport material was applied over the electrical contact layer of indium tin oxide by filling a syringe with 2 milliliters of the solution and delivering the solution to a spin coater through a 0.45 micron filter. The solution was spun in the spin coater at 2000 RPM for 90 seconds. The substrate was removed from the spin coater and dried on a hot plate at 100° C. for 60 seconds. The resulting charge injection layer film was 1000 Angstroms thick.

The patterned layer of light emitting polymer on the donor element was transferred to the charge injection layer by lamination. This lamination was done by using the roll-to-roll Waterproof® Laminator, from DuPont (Wilmington, Del.). Both rollers of the laminator were set at 125° C. and a rotation speed of 100 mm/minute.

Parallel strips of light emitting polymer having a width of 30 microns and a thickness of 1,000 Angstroms with a spacing of 30 microns, were observed to have been transferred to the charge injection layer, under a microscope at an enlargement of 50×, creating an anode for a light emitting display.

A cathode may be deposited on the anode substrate to complete the light emitting display, as described in the next Example.

Example III

In this example, a patterned light emitting display was formed.

The donor element comprised a 1 mil. (0.0254 mm) polyester base element. A heating layer of nickel was electron beam deposited onto the base element to 35% transmission by Vacuum Deposit Incorporated to form the heating layer. The base element and heating layer were cleaned, dried and oxygen plasma treated, as described above in Example I. The light emitting polymer of Example I was applied to the nickel layer. This element was placed in contact with a poly-caprolactone receiver, and exposed by a CREO 3244 Trendsetter, also as described in Example I. The exposure left a desired pattern on the donor element comprising a series of parallel rectangular strips 30 microns thick with 30 micron spaces between them, extending from a larger rectangular section.

The anode portion of the display was formed by sputtering indium tin oxide, described in Example II, onto a polyester substrate, to form the first electrical contact layer. The charge injection layer was prepared using XICP-OSO1, a developmental organic-based conductive polyaniline solution obtained from Monsanto Company, and generally described in U.S. Pat. No. 5,863,465, the relevant portions of which is incorporated herein by reference. XICP-OSO1 contains approximately 48.16 wt. % xylenes, 12.62 wt. % butyl Cellosolve® (which is 2-butoxyethanol)), and 41.4 wt. % conductive polyaniline (PANI), wherein the conductive polyaniline was derived from combining polyaniline base with dinonylnaphthalene sulfonic acid (DNNSA). Butyl Cellosolve® is available from Sigma Aldrich Corporation (Milwaukee, Wis.). The xylene may also be obtained from Aldrich at 99% purity.

A 2.60 wt. % solution of PANI/DNNSA in this example was prepared by mixing 0.9624 grams of the XICP—OSO1 with 14.3594 g xylene (EM Science, purity: 98.5%). The 2.60 wt % PANI/DSSA solution was loaded into a syringe and delivered to a spin coater through a 0.45 micron filter. The solution was spun in the spin coater at 1500 RPM for 90 seconds, removed from the spin coater and dried on a hot plate at 100° C. for 60 seconds. The resulting polyaniline layer had a thickness of 1,000 Angstroms.

The patterned layer of light emitting polymer, formed above, was laminated onto the charge injection layer with a Waterproof® Laminator with both rollers set to 125° C. and a rotation speed of 400 mm/minute. After removal of the donor element, the desired pattern was observed on the surface of the charge injection layer under a microscope at 50×enlargement.

A 2 mm×2 mm electrical contact layer of aluminum was then resistively deposited onto the transferred pattern of light emitting polymer to a thickness of 1500 Angstroms, to form the second electrical contact layer through aluminum masks with 20 2×2 mm openings.

To test the devices, contact pads were first formed by cleaning off the organic material in selected areas with solvents. Power was then applied from a DC power supply and the light output was measured with a luminance meter. The luminescence and current density as a function of the applied voltage at 6 different regions were measured. It was found that the luminescence increased as the applied voltage increased, as would be expected.

What is claimed is:

1. An article of manufacture, comprising:
    a base element; and
    a transferable layer comprising a desired pattern of electroactive organic material supported by the base element, wherein the transferable layer comprises adjacent first and second patterned layers of electroactive organic material wherein the electroactive organic material has not been heated.

2. The article of claim 1, wherein one of the first and second patterned layers is a charge injection/transport material.

3. The article of claim 2, wherein the layer of charge injection/transport material is provided by forming a coating from a conductive polyaniline solution comprising of xylene, 2-butoxyethanol and conductive polyaniline.

4. The article of claim 1, further comprising a heating layer between the base element and the transferable layer.

5. The article of claim 4, wherein the heating layer comprises a metal.

6. The article of claim 1, further comprising means for facilitating transfer of the transferable layer, said means being between the transferable layer and the heating layer.

* * * * *